United States Patent
Hung

(10) Patent No.: US 7,120,772 B2
(45) Date of Patent: Oct. 10, 2006

(54) MICRO-SYSTEM FOR BURN-IN SYSTEM PROGRAM FROM A PLUG-ABLE SUBSYSTEM INTO MAIN MEMORY AND METHOD THEREOF

(75) Inventor: Chi-Cheng Hung, Hsinchu (TW)

(73) Assignee: Cheertek Incorporation, (TW)

( * ) Notice: Subject to any disclaimer, the term of this patent is extended or adjusted under 35 U.S.C. 154(b) by 365 days.

(21) Appl. No.: 10/693,926

(22) Filed: Oct. 28, 2003

(65) Prior Publication Data

US 2004/0255178 A1 Dec. 16, 2004

(30) Foreign Application Priority Data

Feb. 26, 2003 (TW) ............................. 92104054 A

(51) Int. Cl.
*G06F 12/00* (2006.01)
(52) U.S. Cl. ...................... 711/163; 711/115; 711/162; 710/36; 714/5

(58) Field of Classification Search ..................... None
See application file for complete search history.

(56) References Cited

U.S. PATENT DOCUMENTS 5,291,425 A * 3/1994 Nagaishi ........................ 716/4
2002/0023198 A1 * 2/2002 Kokubun et al. ........... 711/162

FOREIGN PATENT DOCUMENTS

EP               265366 A2 *    4/1988

* cited by examiner

*Primary Examiner*—Mano Padmanabhan
*Assistant Examiner*—Craig E Walter
(74) *Attorney, Agent, or Firm*—Lowe Hauptman & Berner LLP.

(57) ABSTRACT

This invention relates to a micro-system for burn-in system program from a backup memory of plug-able subsystem into main memory and method thereof, wherein data codes via the data bus accessed by processor from the backup memory or the main memory are determined by two devices for adjusting level.

20 Claims, 4 Drawing Sheets

1. When the micro-system 100 starts up, the plug-able subsystem 110 is enabled and the main memory 102 is disabled.

2. The processor begins to read the data codes stores in the plug-able subsystem 110.

3. The plug-able subsystem 110 is disabled and the main memory 102 is enabled.

4. After receiving the write signal, the main memory 102 will fetch the data codes from the data bus 122 and write into the regions mapped to the address codes to finish the write operation.

Fig. 6

MICRO-SYSTEM FOR BURN-IN SYSTEM PROGRAM FROM A PLUG-ABLE SUBSYSTEM INTO MAIN MEMORY AND METHOD THEREOF

BACKGROUND OF THE INVENTION

1. Field of the Invention

The present invention relates to a micro-system for burn-in system program into main memory and method thereof, and more particularly to a micro-system for burn-in system program from a backup memory of plug-able subsystem into main memory and method thereof.

2. Description of the Prior Art

In some micro-systems, we have to update system program for newer applicability or development. In the early years, the program memory device was easily plugged in and taken off, it was accomplished by taking the program memory device off, burning the system program into it with a burn-in system, and plugging it into the micro-system. However, it is unsuitable for the program memory device using the newer package technology to be plugged in or taken off, so the micro-system with above program memory device must have a self-updated capacity. But a potential risk is existed that the micro-system fails to start up if a wrong system program is burned into the program memory device. At this time, a method to update the wrong system program in the original program memory device should be provided for the micro-system can start up and run normally again.

A micro-system is only run under the correct system program provided by a program memory device. The micro-system can not be booted to update the correct system program into the program memory device after the wrong system program already saved therein. At present, the only way to boot the system is to provide another program memory device including the correct system program. However, there is still a problem if the original program memory device is not taken off, the wrong system program will be still sent to the processor. It will conflict with the correct system program from another program memory device. Thus, the micro-system still fails to start up.

SUMMARY OF THE INVENTION

In the light of the state of the art described above, it is an object of the present invention to provide a micro-system for burn-in system program from a plug-able subsystem into a main memory, which is immune to the problem that the micro-system fails to start up.

It is another object of the present invention to provide a method to correct and update the main program memory by a plug-able subsystem if the self-update operation of the micro-system failed.

It is a further object of the invention to find out defects in the system by the plug-able subsystem before the products are available in the market.

It is a still further object of the present invention to develop and manufacture the main program memory at the same time without concerning the accuracy of the main program memory. Thus, the time and the cost can be substantially reduced for the manufacturer.

In view of the above and other objects which will become apparent as the description proceeds, there is provided according to a general aspect of the present invention a micro-system for burn-in system program from a plug-able subsystem into a main memory which comprises a processor for sending out a first control signal and a second control signal, wherein a main memory connected electrically with said processor for transferring data between said processor and said main memory; a device for adjusting to first level connected electrically with said processor for receiving said first control signal and connected electrically with said main memory for changing the level of a third control signal to a first level to enable said main memory; and a plug-able subsystem with a backup memory connected electrically with said processor for receiving said second control signal, wherein the data are transferred between said backup memory and said processor when said second control signal is at said first level, and said plug-able subsystem sends out a forth control signal to said main memory for changing said third control signal to a second level to disable said main memory, the data are not transferred between said backup memory and said processor when said second control signal is at said second level, and said third control signal is at said first level to enable said main memory for transferring data between said processor and said main memory.

Base on the idea described above, wherein said second level is higher than said first level.

Base on the aforementioned idea, wherein said device for adjusting to first level includes a first grounded resistor.

Base on the idea described above, wherein transferring data between said processor and said main memory includes the steps of establishing a first bus for transferring the address codes and a second bus for transferring the data codes between said processor and said main memory; and transferring the data codes mapped to the address codes to the processor via said second bus after said main memory receiving a first read signal.

Base on the aforementioned idea, wherein transferring data between said processor and said main memory further comprises the step of writing the data codes mapped to the address codes to said main memory via said second bus after said main memory receiving a first write signal.

Base on the idea described above, wherein transferring data between said processor and said backup memory includes the steps of establishing said first bus for transferring the address codes and said second bus for transferring the data codes between said processor and said backup memory; and transferring the data codes mapped to the address codes to the processor via said second bus after said backup memory receiving a second read signal.

Base on the aforementioned idea, wherein said plug-able subsystem comprises a connector connected electrically with said processor and said main memory; and a device for adjusting to second level connected electrically with said connector for sending out said forth control signal through said connector to change the level of said third control signal.

Base on the idea described above, wherein said device for adjusting to second level includes a second resistor connected to a power.

Base on the aforementioned idea, wherein said connector is a slot.

Base on the idea described above, wherein said main memory is a non-volatile memory.

In view of the above and other objects which will become apparent as the description proceeds, there is provided according to a general aspect of the present invention a method for burn-in the system program from a plug-able subsystem into a main memory in a micro-system, wherein said micro-system includes a processor, said main memory, a device for adjusting to first level to enable said main memory, and said plug-able subsystem with a backup memory which comprises the steps of sending out a first control signal for changing the level of a third control signal and a second control signal to said plug-able subsystem from said processor, wherein the level of said second control signal level is at a first level to enable said plug-able subsystem, and the level of said third control signal is changed to said first level by said device for adjusting to first level; sending out a forth control signal from said plug-able subsystem for changing the level of said third control signal to a second level to disable the main memory; transferring data between said backup memory and said processor; sending out said second control signal to said plug-able subsystem from said processor, wherein said second control signal is at said second level to disable the plug-able subsystem and said forth control signal is not sent out from said plug-able subsystem again; and transferring data between said main memory and said processor.

Base on the idea described above, wherein said second level is higher than said first level.

Base on the aforementioned idea, wherein said device for adjusting to first level has a first grounded resistor.

Base on the idea described above, wherein transferring data between said processor and said backup memory includes the steps of establishing a first bus for transferring the address codes and a second bus for transferring the data codes between said processor and said backup memory; and transferring the data codes mapped to the address codes to the processor via said second bus after said backup memory receiving a second read signal.

Base on the aforementioned idea, wherein transferring data between said processor and said main memory includes the steps of establishing said first bus for transferring the address codes and said second bus for transferring the data codes between said processor and said main memory; and transferring the data codes mapped to the address codes to the processor via said second bus after said main memory receiving a first read signal.

Base on the idea described above, wherein transferring data between said processor and said main memory further comprises the step of writing the data codes mapped to the address codes to said main memory via said second bus after said main memory receiving a first write signal.

Base on the aforementioned idea, wherein said plug-able subsystem further comprises a connector connected electrically with said processor and said main memory; and a device for adjusting to second level connected electrically with said connector for sending out said forth control signal through said connector to change the level of said third control signal.

Base on the idea described above, wherein said device for adjusting to second level includes a second resistor connected to a power.

Base on the aforementioned idea, wherein said connector is a slot.

Base on the idea described above, wherein said main memory is a non-volatile memory.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 6 shows the flowchart of read/write data codes procedures between the backup memory of plug-able subsystem/the main memory and the processor.

DESCRIPTION OF THE PREFERRED EMBODIMENT

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
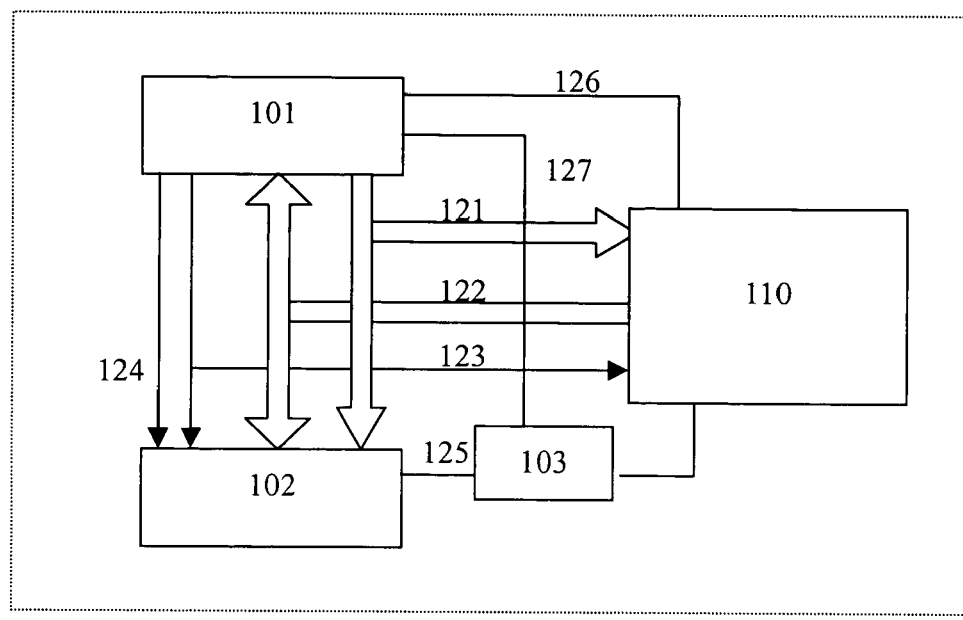
FIG. 1 schematically illustrates the architecture view of the micro-system according to the present invention.

As shown in FIG. 1, a micro-system 100 comprises a processor 101, a main memory 102, a device for adjusting to low level 103, and a plug-able subsystem 110. First, the processor 101 sends out a three-state output control signal 127 and a plug-able subsystem control signal 126 with initial low level. The three-state output control signal 127 can change the level of the main memory selecting control signal 125, which controls the read/write procedures of the main memory 102. Besides, the plug-able subsystem control signal 126 is used to control the procedures of the plug-able subsystem 110. Normally, the processor 101 can be applied to the systems with processor, such as a DVD (digital video/versatile disc) player. The processor 101 will send out the running sequences of the program to the address bus 121. After sending out the read signal 123 to the main memory 102, the processor 101 will fetch the data codes via the data bus 122 from the main memory 102. Subsequently, the processor 101 would decode said data codes and execute the requested procedures. In some conditions, the main memory 102 can be updated thereby. For example, the processor in the DVD player can read the update programs from the disc, and then the processor will write data into the main memory for updating according to the updating procedures. It is noted that no matter what the micro-system 100 executes, the programs of the main memory 102 must be loaded to the micro-system 100 correctly. If the original programs in the main memory 102 fail to boot, the micro-system 100 is impossible to update or run any programs.

The main memory 102, i.e. the main system program memory, is primarily used to store the system program. Normally, the main memory 102 is a non-volatile storage component, such as flash memory or EEPROM. Therefore, the data store in the main memory 102 will not lose when the power is off. The micro-system 100 runs according to the data stored in the main memory 102. The main memory 102 is controlled by the level of the main memory selecting control signal 125. When the level of the control signal 125 is low, the main memory 102 will decode the address codes from the address bus 121, and after receiving the read signal 123, the main memory 102 will send out the data codes mapped to said address codes to the data bus 122. When the micro-system 100 will update its programs, the level of the main memory selecting control signal 125 is pulled down to low level to enable the main memory 102. Then the main memory 102 will decode the address codes on the address bus 121, and after receiving the write signal 124, the main memory 102 will receive the data codes from the data bus 122 and place them to the assigned addresses.

The device for adjusting to low level 103 is used to pull down the level of the main memory selecting control signal 125 to the first level, i.e. low level. It can be easily executed by a grounded resistor. Because the three-state output control signal 127, which is floating and unknown, outputted from the processor 101 is an input signal for the main memory 102, the processor 101 enables the main memory 102 by means of the device for adjusting to low level 103 to pull down the level of the main memory selecting control signal 125 to low level.

Figure 2:
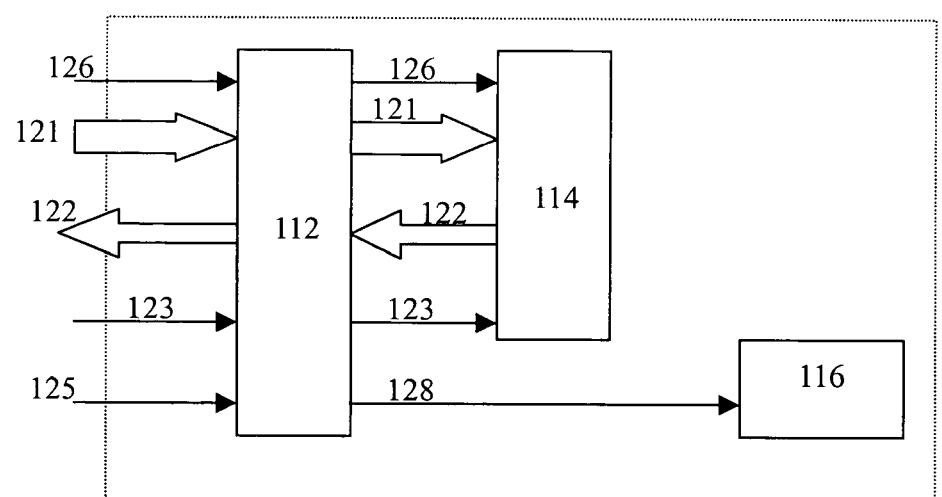
FIG. 2 schematically illustrates the architecture view of the plug-able subsystem in FIG. 1.

The plug-able subsystem 110 works when it is connected with the processor 101, and it can be removable from the micro-system 100. When the micro-system 100 can run normally, the plug-able subsystem 110 is removed from the micro-system 100. On the contrary, when the micro-system 100 is abnormal, the subsystem 110 is installed in the micro-system 100 and replaces the functions of the main memory 102. FIG. 2 shows the architecture view of the plug-able subsystem.

As shown in FIG. 2, the plug-able subsystem 110 comprises a connector 112, a backup memory 114, and a device for adjusting to high level 116. The plug-able subsystem 110 is manufactured as a daughter board to connect electrically with the micro-system 100 via a slot. The connector 112 is primarily responsible for transferring the signals between the processor 101 and the backup memory 114. Said signals comprise the address codes from/to the address bus 121, the data codes from/to the data bus 122, the read signal 123, and the plug-able subsystem control signal 126. Besides, the signals transferred between the device for adjusting to high level 116 and the device for adjusting to low level 103 are also responsible by the connector 112. It is used to change the main memory selecting control signal 125 to the high level to disable the main memory 102 by the high-level control signal 128 sent out from the device for adjusting to high level 116. Normally, the connector 112 can be a slot.

The backup memory 114, named auxiliary program memory or auxiliary system program storage memory, is a general program storage component that can be a non-volatile memory. It is noted that the backup memory 114 is not the system program memory because it is unable to do the self-update. The backup memory 114 is controlled by the plug-able subsystem control signal 126. When the plug-able subsystem control signal 126 is at low level, the backup memory 114 is enabled to turn on the plug-able subsystem 110. On the contrary, when the plug-able subsystem control signal 126 is at high level, the backup memory 114 is disabled to turn off the plug-able subsystem 110.

The device for adjusting to high level 116 is to pull up the level of the main memory selecting control signal 125 to second level, i.e. high level. It is executed by a resistor connected to the power. If the value of the grounded resistor is R1 and the value of the resistor connected to the power is R2, then the ratio of the voltage on the main memory selecting control signal 125 to that of the power line is R1/(R1+R2). Hence, the level of the main memory selecting control signal 125 can be changed from low to high for disabling the main memory 102 by choosing the proper values of R1 and R2 when the plug-able subsystem is connected with the processor 101.

Figure 3:
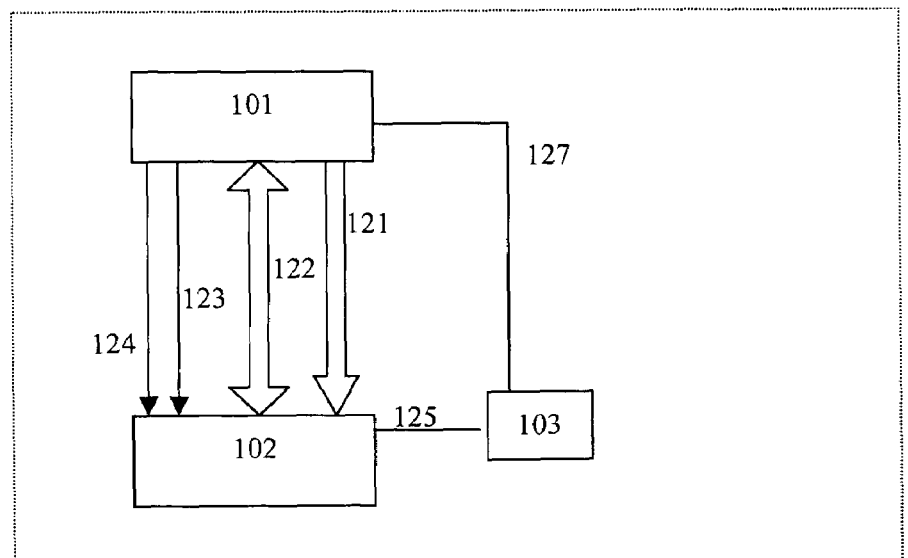
FIG. 3 shows the transferred relationship of data codes, address codes and signals among components while read/write procedures are run between the main memory and the processor.
Figure 4:
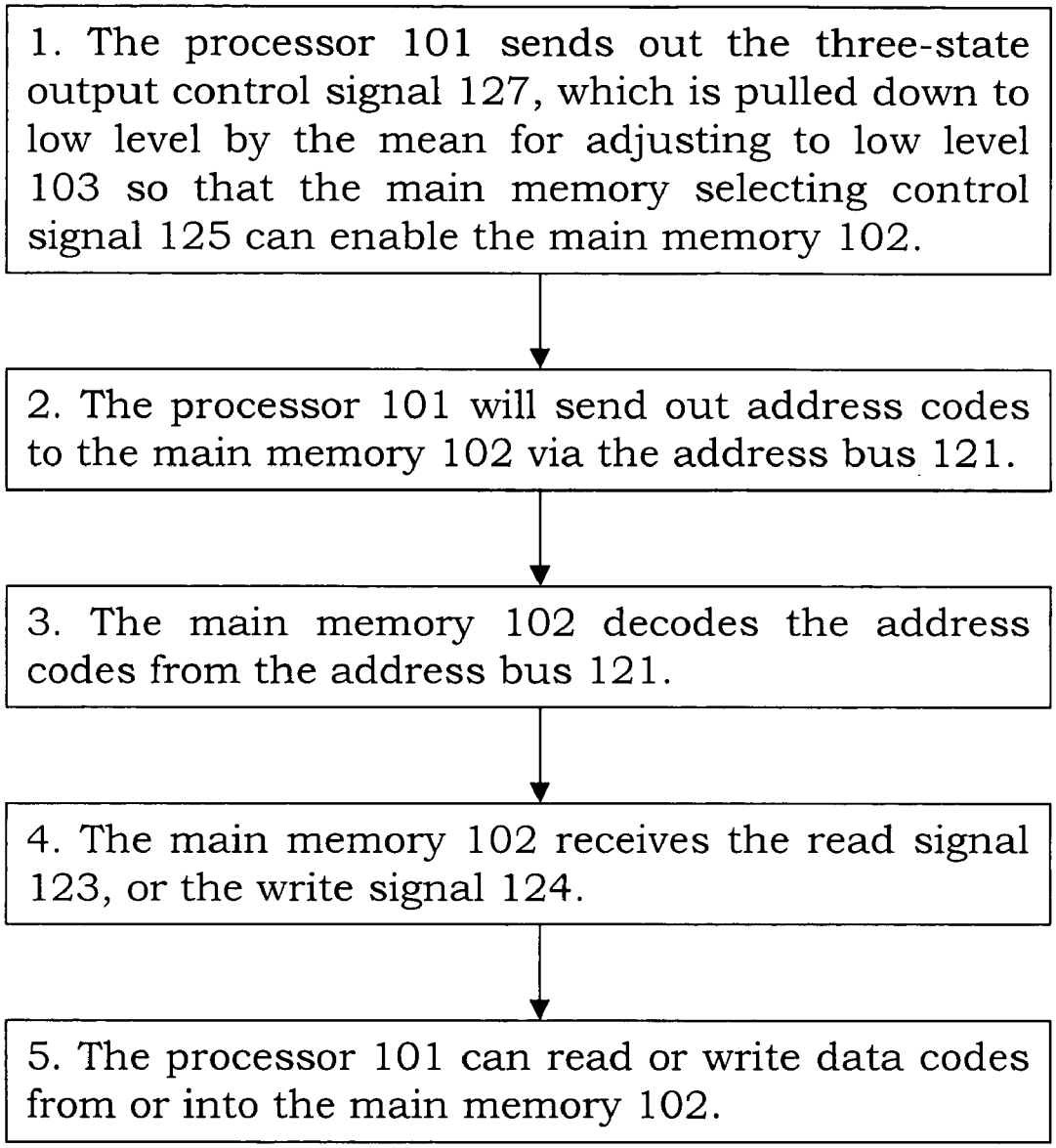
FIG. 4 shows the flowchart of read/write procedures between the main memory and the processor.

In normal conditions, the plug-able subsystem 110 is not plugged in the micro-system 100 when it executes the program, as shown in FIG. 3. There are three components enabled in the system, the processor 101, the main memory 102, and the device for adjusting to low level 103. And the signals from the address bus 121 and the data bus 122 are transferred between the processor 101 and the main memory 102. FIG. 4 shows the flowchart of read/write procedures between the main memory and the processor. When the micro-system 100 starts up, as the Step 1 shown in FIG. 4, the processor 101 sends out two signals: the three-state output control signal 127 with initial floating level and the plug-able subsystem control signal 126 with initially low level. As the plug-able subsystem 110 is not plugged in the micro-system 100, the plug-able subsystem control signal 126 with low level doesn't work. The floating level of the three-state output control signal 127 will be pulled down to low level by the device for adjusting to low level 103 so that the main memory selecting control signal 125 can enable the main memory 102. Then the processor 101 will send out the address codes to the main memory 102 via the address bus 121 as the Step 2 shown in FIG. 4. After the main memory 102 decodes the address codes from the address bus 121 as the Step 3 shown in FIG. 4, the processor 101 can read or write data codes from or into the main memory 102 to do self-update. When the main memory 102 receives the read signal 123, the data codes will be sent out to the processor 101 via the data bus 122. When the main memory 102 receives the write signal 124, the data codes will be written into the regions mapped to said decoded address codes in the main memory 102 as shown in Steps 4~5.

Figure 5:
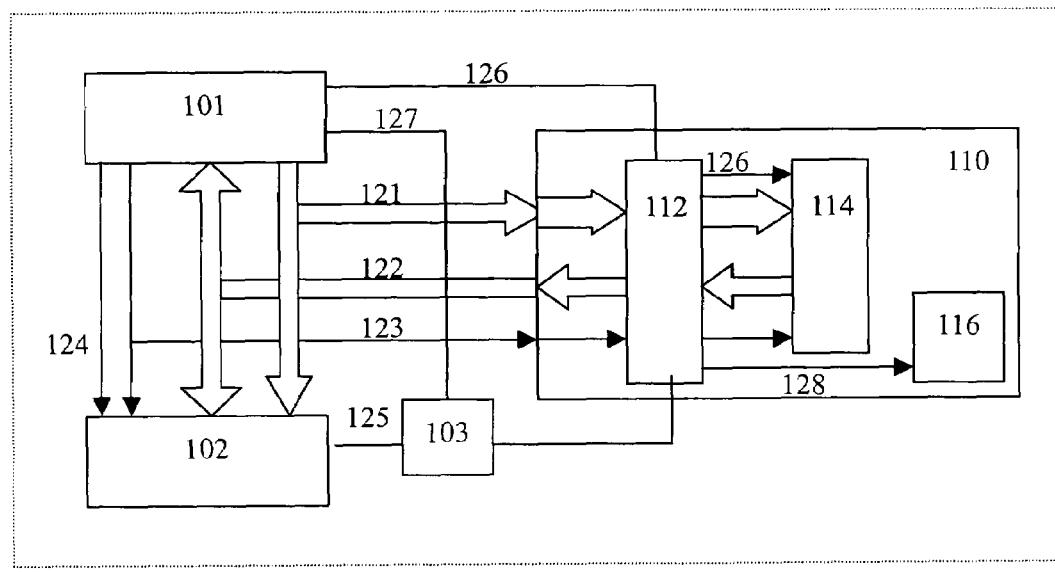
FIG. 5 shows the transferred relationship of data codes, address codes and signals among components while read/write procedures are run between the backup memory of plug-able subsystem/the main memory and the processor.

When the micro-system 100 fails to start up due to the wrong program in the main memory 102, the plug-able subsystem 110 is plugged into the system 100. Said micro-system 100 is shown in FIG. 5, and the flowchart of read/write data codes procedures between the backup memory of plug-able subsystem/the main memory and the processor is shown in FIG. 6. When the micro-system 100 starts up, as the Step 1 shown in FIG. 6, the plug-able subsystem 110 is enabled, and the main memory 102 is therefore disabled. Above step will be described in detail as following. At first, the processor 101 sends out two signals: the three-state output control signal 127 with initial floating level and the plug-able subsystem control signal 126 with low initial level. As the plug-able subsystem 110 is plugged in the micro-system 100, the plug-able subsystem control signal 126 with low level would enable the backup memory 114. Then the device for adjusting to high level 116 can change the level of the main memory selecting control signal 125 to high level by the high-level control signal 128 to disable the main memory 102. Subsequently, as the Step 2 shown in FIG. 6, the processor begins to read the data codes stores in the plug-able subsystem 110. In this step, it will be established an address bus 121 between the connector 112 and the backup memory 114, and then the processor 101 will send out the address codes to the address bus 121. The backup memory 114 will fetch and decode the address codes from the address bus 121. After receiving the read signal 123, the processor 101 will read the data codes from the data bus 122 mapped to said address codes to finish the read operation. It is noted that the data codes are only transferred from the backup memory 114 to the processor 101 because the backup memory 114 can not do self-update.

In order to write the data into the main memory 102, the plug-able subsystem 110 must be disabled, and the main memory 102 must be enabled as the Steps 3~4 shown in FIG. 6. The Step 3 can be achieved by sending out a plug-able subsystem control signal 126 with high level to disable the backup memory 114 from the processor 101. Besides, the high-level control signal with high level is not sent out from the device for adjusting to high level 116 again. Hence, the device for adjusting to low level 103 can change the level of the main memory selecting control signal 125 to the low level. The plug-able subsystem 110 is disabled and the main memory 102 is enabled thereby. In Step 4 shown in FIG. 4, it will be established an address bus 121 and a data bus 122 between the processor 101 and the main memory 102, and then the processor 101 will send out the address codes to the address bus 121. The main memory 102 will fetch and decode the address codes on the address bus 121. After receiving the write signal, the main memory 102 will fetch the data codes from the data bus 122 and write into the regions mapped to the address codes to finish the write operation. Thus, the main memory 102 including the wrong program originally has now finished the self-update process. Afterward, we can remove the plug-able subsystem 110 and reboot the micro-system 100 to check if it works well.

Moreover, if the micro-system 100 fails to start up due to the hardware but the programs in the main memory 102, the plug-able subsystem 110 can be plugged into the system 100 to find out the chip or the component with detects. Above description will be described in detail as following. After plugging the plug-able subsystem 110 into the micro-system 100, the system will read the information in the plug-able subsystem 110, and then the backup memory 114 will send out the debug message to show the booting process. Thereby, the chip or the component with detects can be found by the system 100 by means of designing different notifications corresponding to each chip or the component such as shining or ringing to notify the user. Therefore, it is very convenient for the manufacturer to debug the system.

Furthermore, if defects are found in the system 100 before the products are available in the market, the chip or the component with defects can be found by plugging the plug-able subsystem 110 into the system 100 to pick out and be modified. In addition, the system can be developed and manufactured at the same time without concerning the accuracy of the main program memory. Thus, the time and the cost can be substantially reduced for the manufacturer.

Although the specific embodiment has been illustrated and described, it will be obvious to those skilled in the art that various modifications may be made without departing from what is intended to be limited solely by the appended claims.

What is claimed is:

1. A micro-system for burning-in a system program from a plug-able subsystem into a main memory, comprising:
   a processor for sending out a first control signal and a second control signal;
   a main memory connected electrically with said processor for transferring data between said processor and said main memory;
   a device for adjusting to a first logic-level connected electrically with said processor for receiving said first control signal and connected electrically with said main memory for changing a logic-level of a third control signal to said first logic-level to enable said main memory; and
   a plug-able subsystem with a backup memory connected electrically with said processor for receiving said second control signal, wherein data are transferred between said backup memory and said processor when said second control signal is at said first logic-level, and said plug-able subsystem sends out a forth control signal to said main memory for changing said third control signal to a second logic-level to disable said main memory, and the data are not transferred between said backup memory and said processor when said second control signal is at said second logic-level, and said third control signal is at said first logic-level to enable said main memory for transferring data between said processor and said main memory.

2. The micro-system according to claim 1, wherein said second logic-level is higher than said first logic-level.

3. The micro-system according to claim 1, wherein said device for adjusting to a first logic-level includes a first grounded resistor.

4. The micro-system according to claim 1, wherein transferring data between said processor and said main memory includes the steps of:
   establishing a first bus for transferring address codes and a second bus for transferring data codes between said processor and said main memory; and
   transferring data codes mapped to address codes to the processor via said second bus after said main memory receives a first read signal.

5. The micro-system according to claim 4, wherein transferring data between said processor and said main memory further comprises the step of:
   writing data codes mapped to address codes to said main memory via said second bus after said main memory receives a first write signal.

6. The micro-system according to claim 1, wherein transferring data between said processor and said backup memory includes the steps of:
   establishing a first bus for transferring address codes and a second bus for transferring data codes between said processor and said backup memory; and
   transferring data codes mapped to address codes to the processor via said second bus after said backup memory receives a second read signal.

7. The micro-system according to claim 6, wherein said plug-able subsystem comprises:
   a connector connected electrically with said processor and said main memory; and
   a device for adjusting to a second logic-level connected electrically with said connector for sending out said forth control signal through said connector to change a logic-level of said third control signal to said second logic-level.

8. The micro-system according to claim 7, wherein said device for adjusting to a second logic-level includes a second resistor connected to a power supply.

9. The micro-system according to claim 7, wherein said connector is a slot.

10. The micro-system according to claim 1, wherein said main memory is a non-volatile memory.

11. A method for burning-in a system program from a plug-able subsystem into a main memory in a micro-system, wherein said micro-system includes a processor, a main memory, a device for adjusting to a first logic-level to enable said main memory, and said plug-able subsystem with a backup memory, comprising the steps of:
   sending out a first control signal for changing a logic-level of a third control signal and a second control signal to said plug-able subsystem from said processor, wherein a logic-level of said second control signal level is at a first logic-level to enable said plug-able subsystem, and a logic-level of said third control signal is changed to said first logic-level by said device for adjusting to a first logic-level;

sending out a forth control signal from said plug-able subsystem for changing the logic-level of said third control signal to a second logic-level to disable the main memory;

transferring data between said backup memory and said processor;

sending out said second control signal to said plug-able subsystem from said processor, wherein said second control signal is at said second logic-level to disable the plug-able subsystem and said forth control signal is not sent out from said plug-able subsystem again; and transferring data between said main memory and said processor.

12. The method according to claim 11, wherein said second logic-level is higher than said first logic-level.

13. The method according to claim 11, wherein said device for adjusting to a first logic-level includes a first grounded resistor.

14. The method according to claim 11, wherein transferring data between said processor and said backup memory includes the steps of:

establishing a first bus for transferring address codes and a second bus for transferring data codes between said processor and said backup memory; and transferring data codes mapped to address codes to the processor via said second bus after said backup memory receives a second read signal.

15. The method according to claim 11, wherein transferring data between said processor and said main memory includes the steps of:

establishing a first bus for transferring address codes and a second bus for transferring data codes between said processor and said main memory; and transferring data codes mapped to address codes to the processor via said second bus after said main memory receives a first read signal.

16. The method according to claim 15, wherein transferring data between said processor and said main memory further comprises the step of:

writing data codes mapped to address codes to said main memory via said second bus after said main memory receives a first write signal.

17. The method according to claim 14, wherein said plug-able subsystem further comprises:

a connector connected electrically with said processor and said main memory; and a device for adjusting to a second logic-level connected electrically with said connector for sending out said forth control signal through said connector to change a logic-level of said third control signal.

18. The method according to claim 17, wherein said device for adjusting to a second logic-level has a second resistor connected to a power supply.

19. The method according to claim 17, wherein said connector is a slot.

20. The method according to claim 11, wherein said main memory is a non-volatile memory.

* * * * *